(12) United States Patent
Nevers et al.

(10) Patent No.: US 7,936,578 B2
(45) Date of Patent: May 3, 2011

(54) READ ONLY MEMORY CELL FOR STORING A MULTIPLE BIT VALUE

(75) Inventors: Yannick Marc Nevers, Grenoble (FR); Christophe Denis Lucien Frey, Meylan (FR); Mikael Brun, Grenoble (FR); Nicolaas Klarinus Johannes van Winkelhoff, Villard-Bonnot (FR)

(73) Assignee: ARM Limited, Cambridge (GB)

( * ) Notice: Subject to any disclaimer, the term of this patent is extended or adjusted under 35 U.S.C. 154(b) by 67 days.

(21) Appl. No.: 12/461,966

(22) Filed: Aug. 28, 2009

(65) Prior Publication Data

US 2011/0051487 A1 Mar. 3, 2011

(51) Int. Cl.
*G11C 5/02* (2006.01)
(52) U.S. Cl. ........ 365/51; 365/63; 365/113; 365/185.03
(58) Field of Classification Search .................... 365/51, 365/63, 94, 185.03, 205
See application file for complete search history.

(56) References Cited

U.S. PATENT DOCUMENTS 5,910,921 A * 6/1999 Beffa et al. .................... 365/201
7,692,964 B1 * 4/2010 Sabharwal et al. ...... 365/185.07

* cited by examiner

*Primary Examiner* — Gene N. Auduong
(74) *Attorney, Agent, or Firm* — Nixon & Vanderhye P.C.

(57) ABSTRACT

A read only memory cell for storing a multiple bit value is disclosed. The read only memory cell comprises: at least three output lines, each of the at least three output lines representing a different multiple bit value; a switching device connected between a single one of the three output lines and a voltage source. The switching device provides an electrical connection between the voltage source and the single one of the three output lines in response to a switching signal, a voltage of the connected output line switching value in response to connection to the predetermined voltage and the multiple bit value represented by the output line is thereby selected. There is also an output device provided for outputting the selected multiple bit value.

19 Claims, 7 Drawing Sheets data output [n, n-1..]

```
┌─────────────────────────────────────────┐
│ Form three output lines, a first         │
│ representing 00, a second 01 and a third │
│ 10                                       │
└─────────────────────────────────────────┘
                    │
                    ▼
┌─────────────────────────────────────────┐
│ Connect a voltage source to one or none  │
│ of the output lines via a switch, the    │
│ output line selected depending on the    │
│ multi-bit value to be stored             │
└─────────────────────────────────────────┘
                    │
                    ▼
┌─────────────────────────────────────────┐
│ Connect an output device to the output   │
│ lines, the output device being           │
│ configured to output 00 in response to   │
│ detecting the first output line          │
│ switching voltage value, and to output   │
│ 01 in response to detecting the second   │
│ output line switching voltage value, and │
│ to output 10 in response to detecting    │
│ the third output line switching voltage  │
│ value, and to output 11 in response to   │
│ detecting none of the output lines       │
│ switching voltage value.                 │
└─────────────────────────────────────────┘
```

FIG. 8

READ ONLY MEMORY CELL FOR STORING A MULTIPLE BIT VALUE

BACKGROUND OF THE INVENTION

1. Field of the Invention

The present invention relates to ROM bit cells and their method of manufacture.

2. Description of the Prior Art

ROM cells are used to store values permanently, such that on power down the value stored is not lost. ROM cells traditionally have stored a single bit value. High density ROM bit cell arrays composed of columns of bit cells have been achieved by implementing arrangements in which adjacent bit cells in the same column share a source/drain connection to an adjacent bit line or virtual ground line.

In U.S. Pat. No. 5,917,224 a compact ROM matrix is disclosed in which two adjacent columns of bit cells share a virtual ground line. FIG. 9 schematically illustrates the arrangement disclosed. A ROM bit cell array 100 is composed of transistors 112 arranged in columns, of which only three (114, 116 and 118) are shown. A high density of cells is achieved in the vertical direction by virtue of adjacent bit cells in each column sharing source or drain (generically referred to herein as "drain") connections. These drain connections connect each transistor in each column to either a virtual ground line shared with an adjacent column of transistors or to a bit line uniquely associated with that particular column. For example the two transistors 112a and 112b illustrated in column 118 share a common drain connection to bit line $BL_2$. Transistor 112a shares a drain connection with the transistor above it to virtual ground line 120, whilst transistor 112b shares a drain connection with the transistor below it to bit line $BL_2$. Each transistor encodes a logical "0" or "1" by both its drain connections connecting to the same line (bit or virtual ground) or by one drain connection connecting to each kind of line. Thus when a particular bit line is charged (e.g. $BL_2$) and a particular word line enabled (e.g. $WL_1$), then the transistor located at the intersection of those lines (in this example transistor 112a) will manifest the logical "0" encoded by its drain connections by discharging bit line $BL_2$ onto virtual ground line 120. Conversely if word line WL2 were enabled instead (in order to read transistor 112b), no significant discharge of the bit line would occur (both drains of transistor 112b connect to the same line), indicating a logical "1" encoded by its drain connections (it will be understood that the encoding of "1" and "0" described above is merely a convention choice and could be trivially inverted). Columns 116 and 118 share virtual ground line 120, and have their own bit lines $BL_1$ and $BL_2$, respectively. Similarly column 114 shares virtual ground line 122 with the column of transistors to its left (not illustrated) and has its own dedicated bit line $BL_0$. The transistors 112 are switched in rows by word lines $WL_0$, $WL_1$, $WL_2$ and $WL_3$. For clarity the word lines are not fully illustrated.

The design of bit cells in systems such as that described above has concentrated on how to decrease the area of the cells. However, the area occupied by an array of these cells could also be improved by allowing them to store multiple bit values and thereby reducing the number required.

U.S. Pat. No. 6,636,434 discloses a ROM bit cell that has been designed to store multiple bit values. It is similar to the device of FIG. 9 but has multiple bit lines and corresponding complementary bit lines and can store a multiple bit value in a single cell by connecting to the appropriate lines. The stored values are read by sensing the difference in voltage levels between a bit line and its complementary bit line using sense amplifiers. Thus, for every additional bit that the cell can store, a bit line and its complementary bit line and an additional sense amplifier circuit are required, this is costly in area.

It would be desirable to provide a multiple bit ROM cell, without increasing the area of the cell or the cost of the output devices required unduly.

SUMMARY OF THE INVENTION

A first aspect of the present invention provides a read only memory cell for storing a multiple bit value, said read only memory cell comprising: at least three output lines, each of said at least three output lines representing a different multiple bit value; a switching device connected between a single one or none of said at least three output lines and a voltage source for supplying a predetermined voltage and configured to provide an electrical connection between said predetermined voltage and said single one or none of said at least three output lines in response to a switching signal, a voltage of said connected output line switching value in response to connection to said predetermined voltage and said multiple bit value represented by said output line thereby being selected; and an output device for outputting said selected multiple bit value.

The present invention provides a ROM cell that can store multiple bit values by providing the cell with multiple pre-decoded output lines, each of these output lines representing a different multiple bit value. This allows a cell to store a desired multiple bit value simply by providing a connection to the appropriate output line.

This has the further advantage that as the storage of a value is done by connecting to an output line, it is simply selection of this output line that needs to be detected to detect the stored value, as opposed to detection of the difference in voltage levels of a bit line and its complimentary bit line as in devices of the prior art, and this is easier to detect.

Thus, by providing pre-decoded output lines and a corresponding output device a bit cell that can store a multiple bit value is generated.

In some embodiments, said output device is configured to output a further multiple bit value in response to selection of none of said at least three output lines.

Although in some embodiments there is an output line for each of the multiple bit values that the bit cell can store, in some embodiments there is one fewer and the selection of no output line is decoded by the output device to correspond to selection of a predetermined multiple bit value that is not represented by any of the output lines. In this way, an additional output value can be provided without increasing the number of output lines.

It should be noted that the number of output lines increases with the number of bits n that the cell can store and is generally at least $2^n-1$.

In some embodiments, said output device comprises logic gates responsive to signals switching between two values.

As it is simply selection of a line that needs to be detected, i.e. the connection of that line to a predetermined voltage, a digital detecting device comprising simple logic gates can be used as the output device to detect and output the values. In this way, the need for sense amplifiers that detect analogue changes in voltage levels between two complementary lines is no longer required. This provides a significant saving in area over devices of the prior art.

Although the switching device can be a number of things, in some embodiments it comprises a transistor.

Transistors are simple area efficient switching devices and are commonly used to form ROM cells.

In some embodiments, said switching device comprises a MOS transistor with a gate, and two drains, a first drain being connected to said predetermined voltage and a second drain to one or none of said at least three output lines.

A conventional way of arranging the transistor is to have one drain (sometimes called the source) connected to the predetermined voltage and the other drain to the output line.

In some embodiments, said first drain is connected to said predetermined voltage by a metallisation layer connection.

A further advantage of embodiments of the present invention is that connections can be made by metallisation layer connections.

In some embodiments, said second drain is connected to one of said plurality of output lines by a metallisation layer connection.

When forming connections to output lines to program the read only memory cell, it is very advantageous if the connection to the selected output line can be made by a metallisation layer. Metallisation layer connections are less expensive to implement when programming these circuits than connections by vias, this is because via masks are expensive to implement and thus, creating new masks for metallisation layers is considerably cheaper than creating new via masks.

In some embodiments, at least some of said at least three output lines comprise lines in different metallisation layers arranged on top of each other, said second drain having corresponding layers for connection to a selected output line via said metallisation layer.

Although the output lines can be arranged in a number of ways, it is convenient if at least some of them are arranged in different layers arranged on top of each other with the drain of the transistor that is to connect to one of them having corresponding layers, such that a metallisation connection can be simply formed between the drain and the required output line. It should be noted that the number of output lines that can be arranged on top of each other depends on the way the cell is formed. Thus, it may be convenient for a two bit cell to have three or four output lines arranged on top of each other, while with a three bit cell requiring seven output lines it may also be convenient to have three or four output lines arranged on top of each other and to generate the required seven output lines by having output lines arranged on either side of the transistor forming the cell.

In some embodiments, all of said at least three output lines are arranged on top of each other and said output lines extend into a neighbouring cell.

If the output lines are provided only on one side of the cell then they can extend into the next cell in an array, as that cell being identical in form even if not in connections, will not have output lines on the overlapping side. In this way a reduced area cell can be produced. If however, a bit cell has output lines on both sides of the transistor then they cannot extend into the neighbouring cell.

A second aspect of the present invention provides a memory comprising plurality of read only memory cells according to a first aspect of the present invention, each read only memory cell sharing a connection to said predetermined voltage with a neighbouring memory cell, such that said first drain of one cell is connected to said first drain of said neighbouring cell, said second drains of said two neighbouring cells being separated from drains of other cells and being connected to one or none of said output lines.

When connecting these read only memory cells together to form a memory, two neighbouring cells can share a drain but no more than two cells can be connected together in this way. This means that the area savings from connecting drains of neighbouring cells is limited compared for example to the device disclosed in U.S. Pat. No. 5,917,224. This is a disadvantage, however, this disadvantage is more than mitigated by these cells being able to store multiple bit values and not requiring sense amplifiers to detect the values stored.

In some embodiments, said plurality of read only cells are arranged in an array, each column of said array of read only cells share said at least three output lines, a row of cells being connected to receive a same switching signal and being responsive to said received switching signal to each output said stored multiple bit value.

A third aspect of the present invention provides a method of manufacture of a read only bit cell for storing a multiple bit value comprising: forming at least three output lines each of said at least three output lines representing a different multiple bit value; connecting a switching device between a single one or none of said at least three output lines and a predetermined voltage, said switching device being configured to provide an electrical connection between said predetermined voltage and said single one or none of said connected at least three output lines in response to a switching signal and thereby select said multiple bit value represented by said output line; providing an output device for outputting said selected multiple bit value in dependence upon said output line selected.

The above, and other objects, features and advantages of this invention will be apparent from the following detailed description of illustrative embodiments which is to be read in connection with the accompanying drawings.

BRIEF DESCRIPTION OF THE DRAWINGS

FIG. 7 shows in layout form the layers of FIG. 4a;

FIG. 8 shows a flow diagram illustrating steps in a method of manufacture of a mulitbit ROM cell according to an embodiment of the present invention.

DESCRIPTION OF THE PREFERRED EMBODIMENTS

Figure 1:
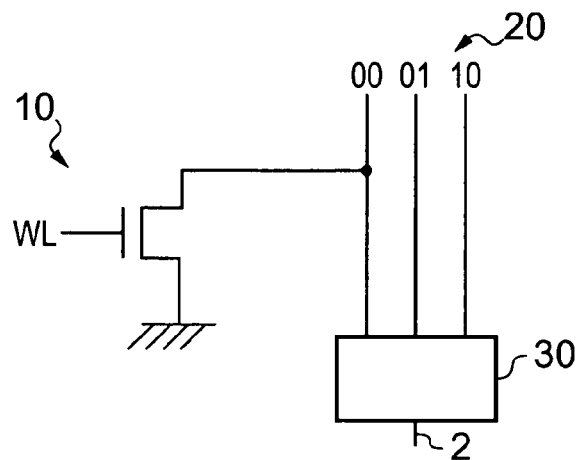
FIG. 1 schematically shows a multiple bit ROM cell according to an embodiment of the present invention.

FIG. 1 shows a ROM bit cell according to an embodiment of the present invention. The ROM bit cell comprises a transistor 10 that has its drain, connected to one of the output lines 20 and its source connected to virtual ground. The output lines are pre-decoded output lines, in that each one of the output lines represents a predetermined value.

During a read cycle, the output lines are precharged and in response to a signal being applied to the word line attached to the gate of the transistor 10, the transistor is turned on and the output line connected to the transistor is discharged through the transistor, so that transistor 10 pulls the value of the pre-charged line down from a nominal 1 to a nominal 0. Thus, in this case output line that represents 00 is pulled down to a 0 and an output device 30 detects this voltage change on this respective line and outputs a corresponding 00.

Output device 30 is configured to detect any one of the output lines switching state and in response to detecting this it selects the output value represented by the respective output line. In this way, although only a single line is selected, a two bit output value is output as each line represents a two bit value. It should be noted that if none of the lines are selected and all of the lines retain their nominal 1, then output device 30 is configured to output a 11. In this way, in response to three input lines the output device can output four values.

As the output device simply has to detect the fall in value of one of the lines from a logical 1 to a logical 0, it can do this using logical switching devices which are cheap to implement, rather than by using the traditional sensing amplifiers that detect changes in analogue signals that conventional bit cells have used.

Figure 2:
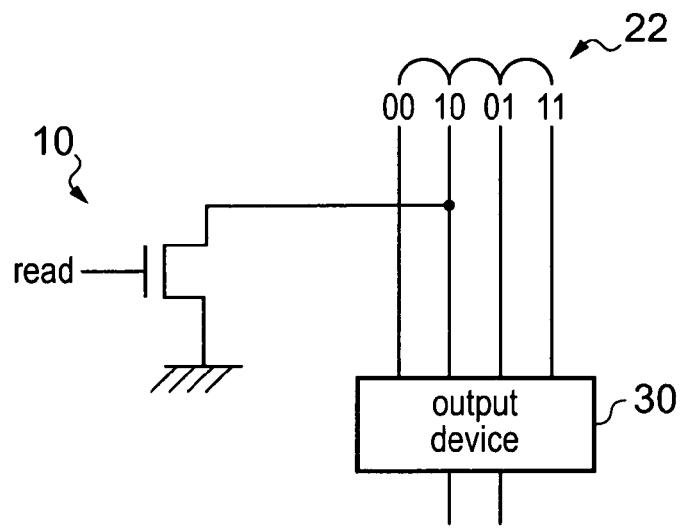
FIG. 2 schematically shows a multiple bit ROM cell according to a different embodiment of the present invention.

FIG. 2 shows an alternative embodiment of the ROM bit cell, in which transistor 10 is connected to four output lines 22. In this embodiment, there is a fourth output line that represents the value 11 and if this value is to be stored in the ROM bit cell, the bit cell has its drain connected to this output line.

Figure 3:
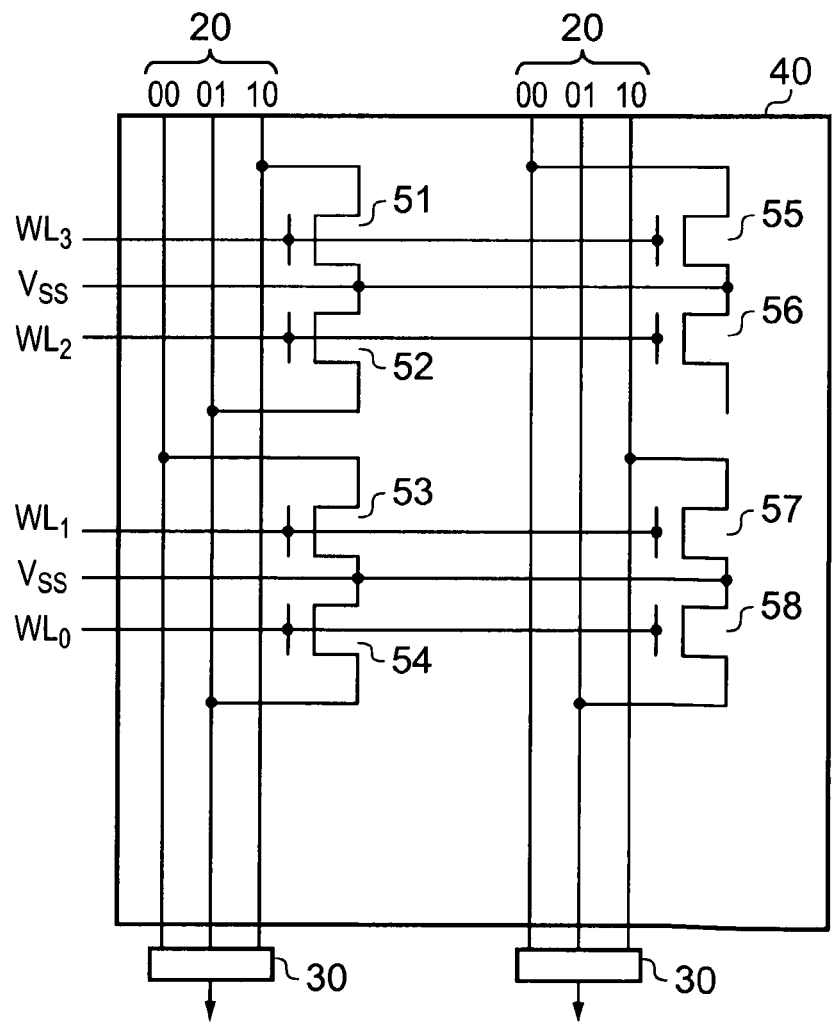
FIG. 3 shows a portion of a memory comprising a plurality of multibit ROM cells according to an embodiment of the present invention.
Figure 9:
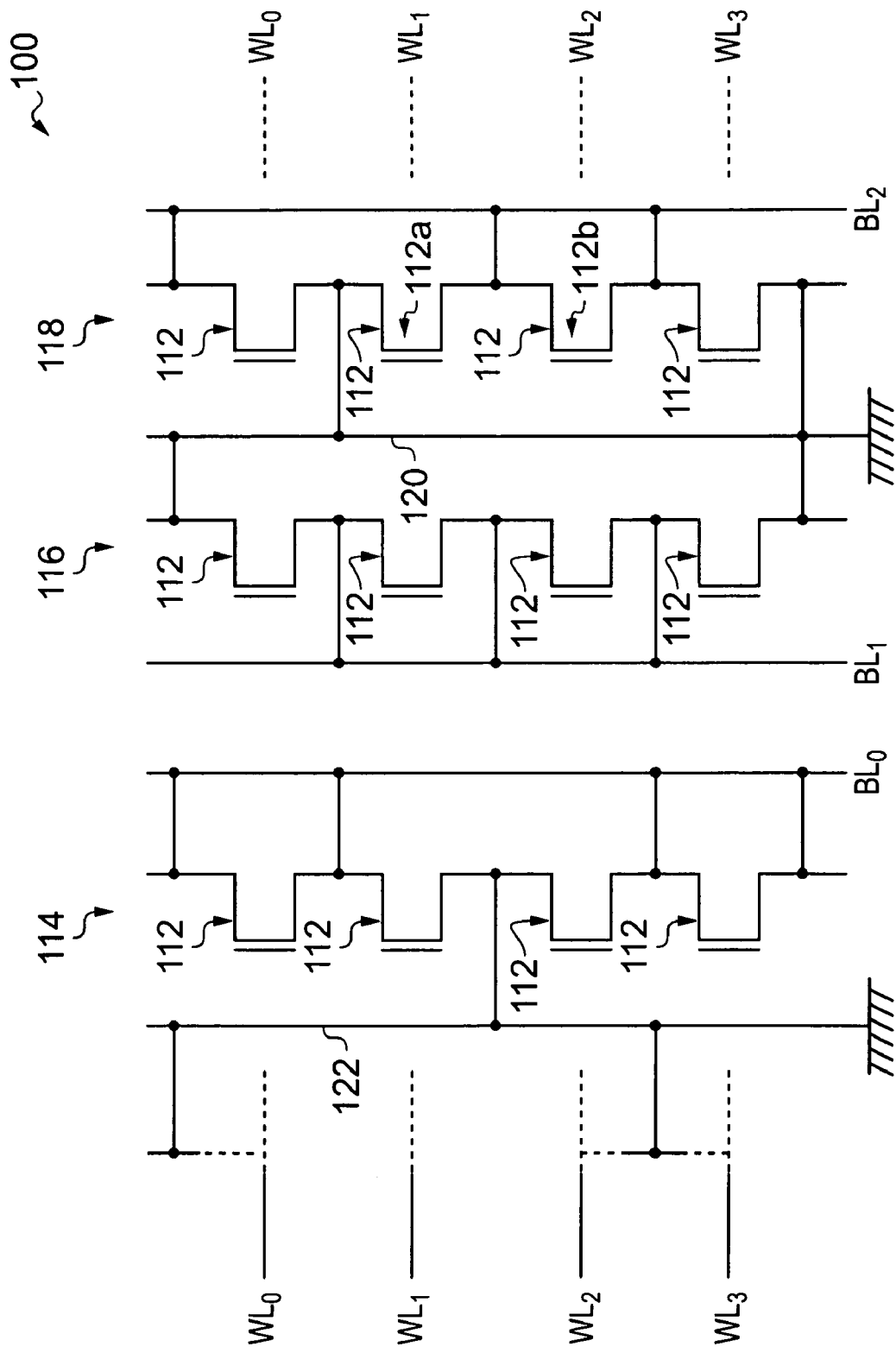
FIG. 9 shows a schematic diagram of a prior art ROM bit cell array.

FIG. 3 shows a portion of a memory 40 comprising a plurality of bit cells 51-58. Two adjacent bit cells have shared drains and these are connected to virtual ground Vss. Other cells neighbouring the two adjacent bit cells are not connected together. This is in contrast to devices of the prior art such as is shown in FIG. 9, where in a column of bits cells each bit cell had its drains connected to an adjacent cell. Only connecting two adjacent cells together is more expensive in area than all cells being connected, however, in this device there is no complementary line to each output line and sense amplifiers to read the output values are not required.

The drains cannot be connected together in a complete column as each of the transistors stores a particular value by being connected via one of its drains to an output line, the output line being selected depending on the value that the cell stores. Thus, there is a requirement that each transistor has a drain that is not connected to another transistor so that it can be connected independently of other cells, to a particular output line. In this respect if a transistor is to store a 11 then it will select not to connect to any output line, as the bit cells in this array are similar to the bit cells shown in FIG. 1, and selection of no output line is recognised as being equivalent to storing a 11. Transistor 56 for example is part of a cell storing a 11.

In response to a signal on the word line, the transistor connected via its gate to the word line is turned on and the output line it is connected to is discharged. This is recognised by the output device which outputs the value. Thus, if a signal were sent on word line WL0, the transistors 54 and 58 would be turned on. In response to them turning on, the precharged bit line corresponding to output lines 01, 01 would be discharged and thus, the output devices 30 would output a 0101.

If word line WL1 were selected, then transistor 53 would discharge output line representing 00 while transistor 57 would discharge output line representing 10. In this case, output devices 30 would output a 0010.

If in response to a signal selecting a wordline no output line is detected as being discharged for a cell then the output device 30 would output a 11 for the corresponding cell.

Although embodiments of the invention have shown the output of two bit values from a bit cell, it should be clear to a skilled person that with additional output lines additional bit values could be stored in a ROM cell. Thus, if seven output lines were provided, eight different values could be encoded and thus, a three bit value could be output. In general to store an n bit number there will be required $2^n-1$ output lines to encode the required number of values.

It should be noted that although the virtual ground connections Vss are shown as connecting horizontally across the array, they could be arranged vertically connecting the shared drains of columns of the devices to the virtual ground.

Figure 4A:
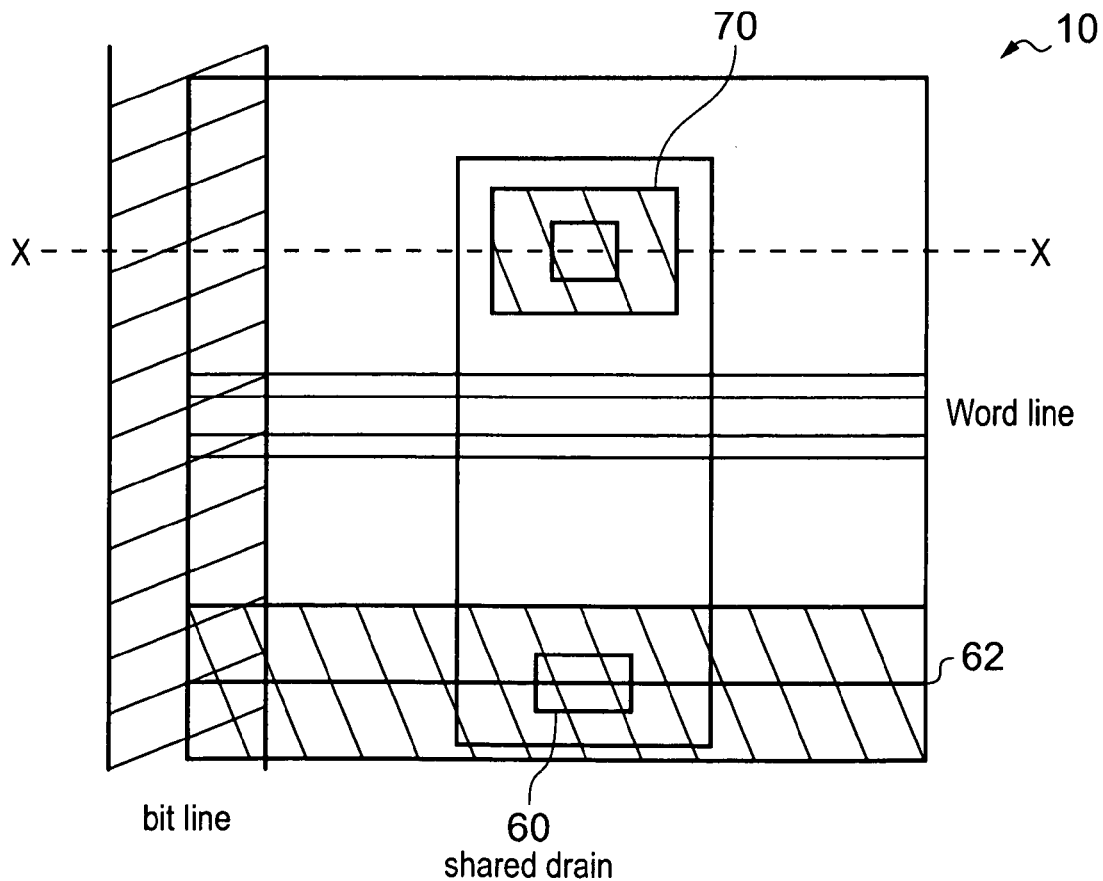
FIG. 4a shows in layout form a multibit ROM cell designed to store a two bit number according to an embodiment of the present invention.

FIG. 4*a* shows a layout example of a bit cell 10 designed to store a two bit number according to an embodiment of the present invention. This shows the shared drain 60 that crosses the boundary 62 of the cell and extends into the neighbouring cell, the drain 70 that connects to the selected output line, the word line which is used to turn the transistor on, and the bit line, which although shown as a single entity is in fact several bit lines arranged on top of each other and corresponding to the output lines of the previous Figures. Thus, drain 70 is connected to one of the output lines or bit lines depending on the multibit value that the ROM cell has been programmed to store, and in response to a signal on the word line, the transistor is turned on and a connection is formed between the connected bit line and the shared drain that is connected to virtual Vss. In this way the connected bit line is discharged and the value of this output line that is in this way selected can then be output.

As can be seen the bit line/output line extends beyond the edge of the cell. This is acceptable as there are no bit lines on the other side of the cell, thus the overlap does not cause problems for that cell. In embodiments of the invention where larger multibit values are stored, for example where a 3 bit value is stored, then output lines may be arranged on either side of the cell and then they cannot overlap onto neighbouring cells. This means the cells need to be made slightly larger.

Figure 4B:
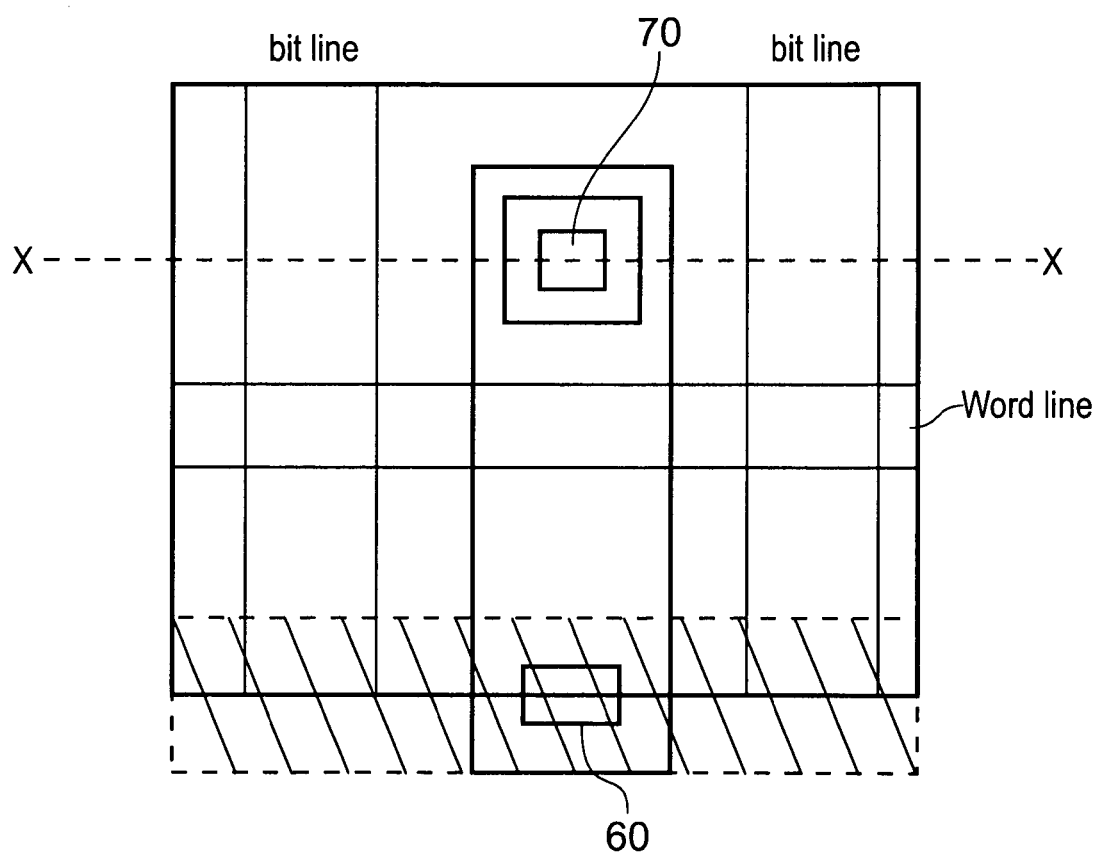
FIG. 4b shows in layout form a multibit ROM cell designed to store a three bit number according to an embodiment of the present invention.

FIG. 4*b* shows a layout example similar to that of FIG. 4*a* but of a bit cell designed to store a three bit number. As can be seen in this diagram, there are two output or bit lines on either side of the drain connections and as such they cannot extend over the drain connections of the cell.

Figure 5A:
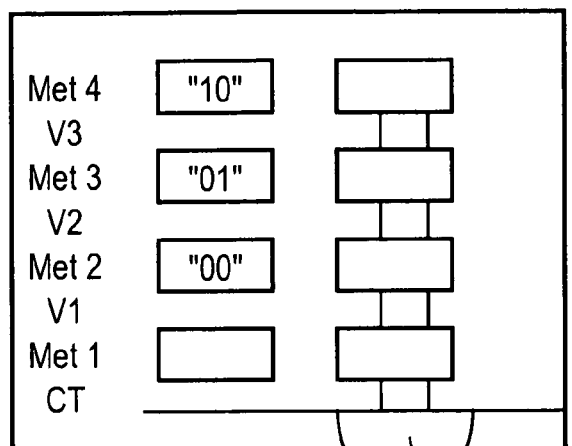
FIG. 5a shows a cross section through the line XX of the cell of FIG. 4.

FIG. 5*a* shows a cross-section of the transistor of FIG. 4*a* through the line XX. In this embodiment there are four metallisation layers, the top three metallisation layers Met 2 to Met 4 corresponding to the three output lines of FIG. 1. These are aligned with connecting metallisation layers that connect to the drain 70 of the transistor shown in FIG. 4*a*. Thus, when programming the ROM cell to store a desired value, a connection is made between the selected output line and the adjacent metallisation line connected to the drain.

In this embodiment there are four metallisation layers shown, three having output lines with pre-decoded values, the fourth value corresponding to no line being selected, and the additional metallisation layer being provided so that there is an additional contact if required. It could, for example, be used to program an additional output line 11 if it was desirable not to encode a "no line select" or it could be used for other purposes. It should be clear to a skilled person that this additional layer is not required and the device could be built with simply three metallisation layers.

Figure 5B:
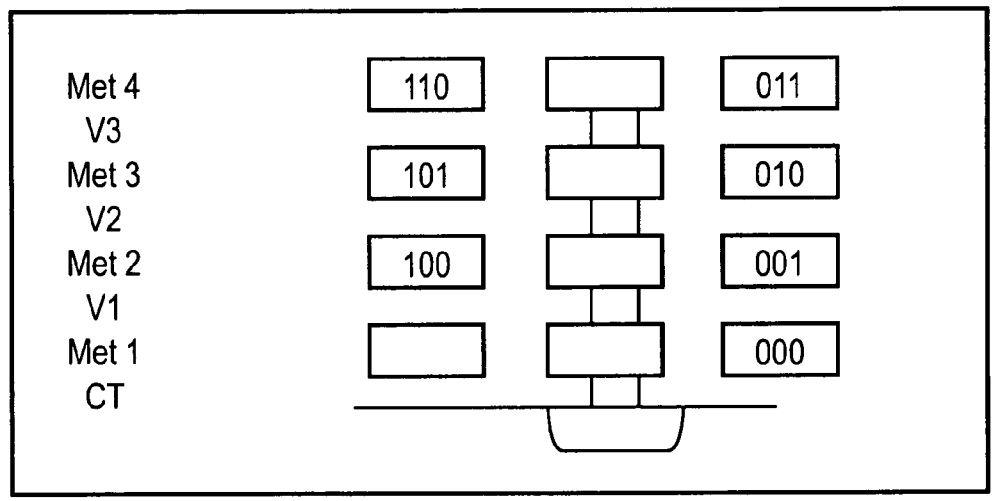
FIG. 5b shows a cross section through the line XX of the cell of FIG. 4b.

FIG. 5*b* shows a cross-section of the transistor of FIG. 4*b* through the line XX. The bit cell has four metallisation layers like the bit cell of FIG. 5*a* but in contrast it has output or bit lines arranged on either side of the drain connections. In this way more output lines are provided without the need to provide additional metallisation layers, but with an additional area requirement as the bit lines can no longer overlap with a neighbouring cell.

Figure 6:
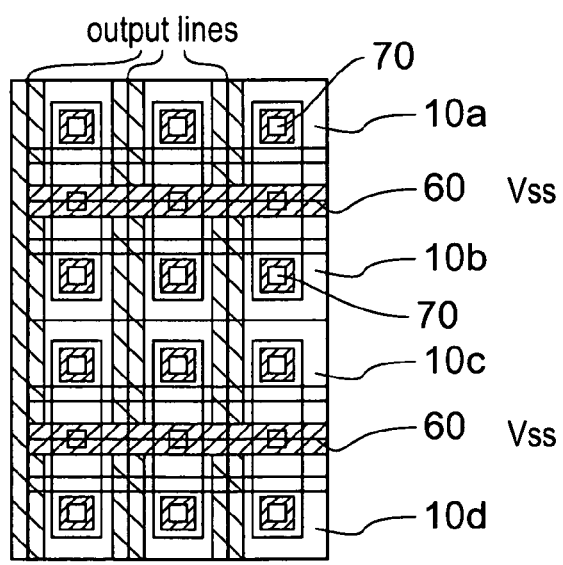
FIG. 6 shows a plurality of the cells of FIG. 4 arranged to form a memory array.

FIG. 6 shows a plurality of the bit cells shown in FIG. 4 arranged along side each other. This Figure shows how drains 60 of two neighbouring cells 10a and 10b, and 10c and 10d are shared, whereas drains 70 between cells 10b and 10c are not shared.

The separation between the drains could be arranged by spacing as is shown in this Figure, or it could be provided by using an isolated structure such as a poly structure connected to virtual ground.

The word line can be provided in an upper or a lower level. The pre-decoded bit line is provided in several metal layers as is shown in FIG. 5 and these can be shared between cells or not.

It should be noted that by using metallisation layers for programming the ROM bit cell, the manufacture of these cells is made simpler than had vias been used.

Figure 7:
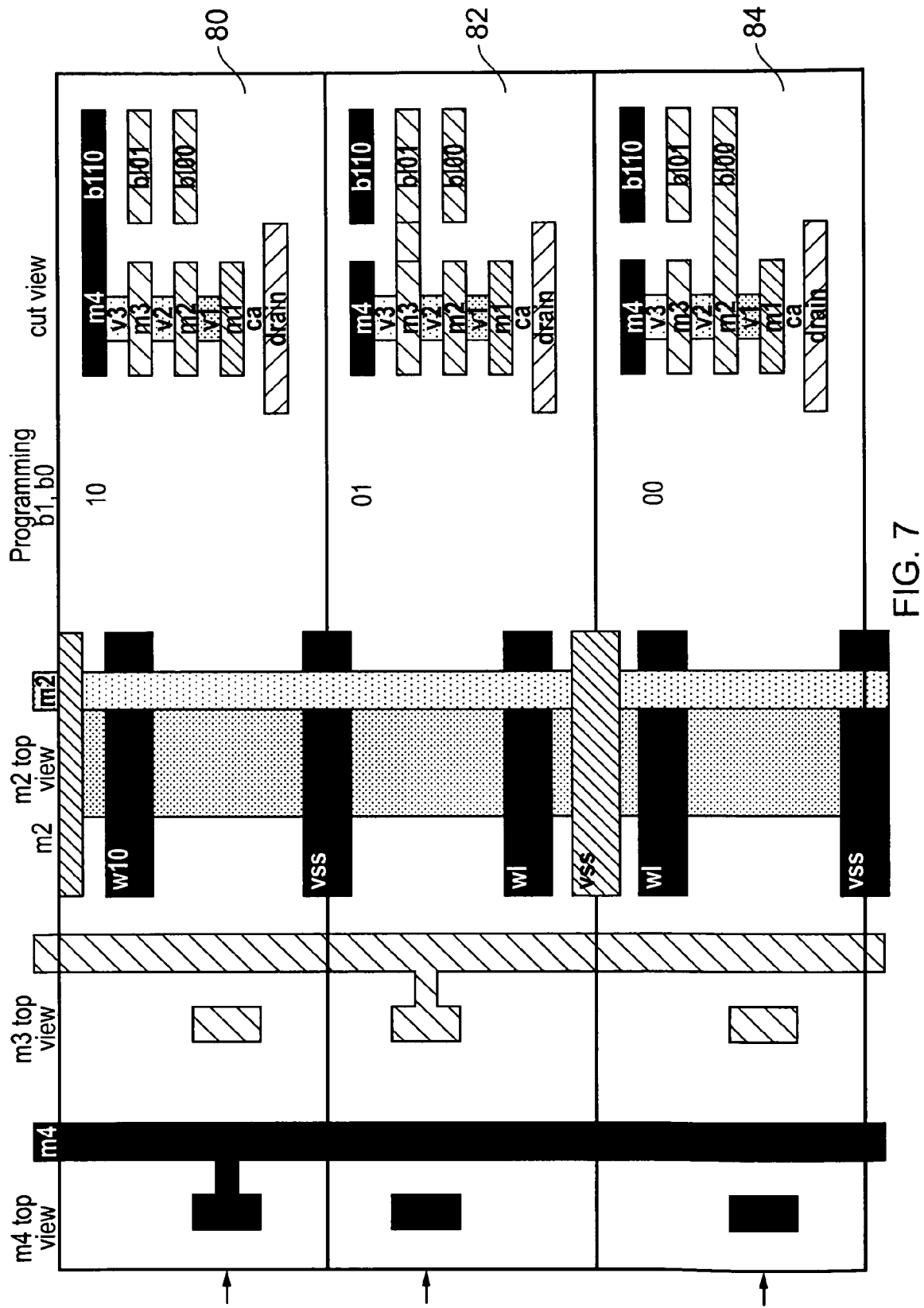

FIG. 7 shows a cross-section of a row of bit cells that have been programmed. In these cells the output line in the top layer M4 represents an output value of 10, the output line in the next layer M3 represents 01 and the output line in the M2 layer 00, no connection represents 11. In this example the top cell 80 is programmed to store 10 by making a connection between the output line and the drain in the M4 layer. The next cell 82 stores a 01 by a connection in the M3 layer and the next cell 84 stores 00 by a connection in the M2 layer. The three left hand views show the respective layers, M4, M3 and M2, and the right hand view shows a cross section, similar to that of FIG. 5, but with the connection to a selected output line having been formed.

FIG. 8 shows a flow diagram illustrating a method of manufacturing a multiple bit ROM cell according to an embodiment of the present invention. Initially three output lines are formed, a first representing 00, a second 01 and a third 10. Then depending on the value that the cell is to store, a voltage source is connected to the appropriate one (or to none) of the output lines via a switch, such that the connection can be turned on or off. An output device is then connected to the output lines. The output device is configured to output 00 in response to detecting the first output line switching voltage value, to output 01 in response to detecting the second output line switching voltage value, to output 10 in response to detecting the third output line switching voltage value, and to output 11 in response to detecting none of the output lines switching voltage value. In this way a multiple bit ROM cell is manufactured, capable of being programmed to store a two bit value.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

We claim:

1. A read only memory cell for storing a multiple bit value, said read only memory cell comprising:
   at least three output lines each of said at least three output lines representing a different multiple bit value;
   a switching device connected between a single one or none of said at least three output lines and a voltage source for supplying a predetermined voltage and configured to provide an electrical connection between said predetermined voltage and said single one or none of said at least three output lines in response to a switching signal, a voltage of said connected output line switching value in response to connection to said predetermined voltage and said multiple bit value represented by said output line thereby being selected;
   an output device for outputting said selected multiple bit value.

2. A read only memory cell according to claim 1, wherein said output device is configured to output a further multiple bit value in response to selection of none of said at least three output lines.

3. A read only memory cell according to claim 1, wherein said output device comprises logic gates responsive to signals switching between two values.

4. A read only memory cell according to claim 1, wherein said switching device comprise a transistor.

5. A read only memory cell according to claim 4, wherein said switching device comprises a MOS transistor with a gate, and two drains, a first drain being connected to said predetermined voltage and a second drain to one or none of said at least three output lines.

6. A read only memory cell according to claim 5, wherein said first drain is connected to said predetermined voltage by a metallisation layer connection.

7. A read only memory cell according to claim 5, wherein said second drain is connected to one of said plurality of output lines by a metallisation layer connection.

8. A read only memory cell according to claim 5, wherein at least some of said at least three output lines comprise lines arranged in different metallisation layers on top of each other, said second drain having corresponding layers for connection to a selected output line via said metallisation layer.

9. A read only memory according to claim 8, wherein all of said at least three output lines are arranged on top of each other and said output lines extend into a neighbouring cell.

10. A memory comprising a plurality of read only memory cells according to claim 5, each read only memory cell sharing a connection to said predetermined voltage with a neighbouring memory cell, such that said first drain of one cell is connected to said first drain of said neighbouring cell, said second drains of said two neighbouring cells being separated from drains of other cells and being connected to one or none of said output lines.

11. A memory according to claim 10, wherein said plurality of read only cells are arranged in an array, each column of said array of read only cells share said at least three output lines, a row of cells being connected to receive a same switching signal and being responsive to said received switching signal to each output said stored multiple bit value.

12. A method of manufacture of a read only bit cell for storing a multiple bit value comprising:
   forming at least three output lines each of said at least three output lines representing a different multiple bit value;
   connecting a switching device between a single one or none of said at least three output lines and a predetermined voltage, said switching device being configured to provide an electrical connection between said predetermined voltage and said single one or none of said connected at least three output lines in response to a switching signal and thereby select said multiple bit value represented by said output line;

providing an output device for outputting said selected multiple bit value in dependence upon said output line selected.

13. A method according to claim 12, wherein
said output device is configured to output a further multiple bit value in response to selection of none of said at least three output lines.

14. A method according to claim 12, comprising forming said output device from logic gates that are responsive to signals switching between two values.

15. A method according to claim 12, wherein said switching device is configured from a mos transistor with a gate, and two drains, and said step of connecting said switching device between said one of none of said at least three output lines and said predetermined voltage comprises connecting a first drain to said predetermined voltage and a second drain to one or none of said at least three output lines.

16. A method according to claim 15, wherein said step of connecting said switching device to said predetermined voltage comprises forming a metallisation layer connection between said transistor and said voltage source.

17. A method according to claim 15, wherein said step of connecting said second drain to one of said plurality of output lines comprises forming a metallisation layer connection.

18. A method according to claim 15, wherein said plurality of output lines are formed from metallisation layers arranged on top but separated from each other, said second drain being formed from corresponding layers for connection to a selected output line via a metallisation layer.

19. A means for permanently storing a multiple bit value, said means comprising:
at least three output line means each for representing a different multiple bit value;
a means for switching connected between a single one or none of said at least three output line means and a means for supplying a predetermined voltage, and said means for switching being for providing an electrical connection between said means for supplying said predetermined voltage and said connected one or none of said at least three output line means in response to a switching signal, a voltage of said connected output line means switching value in response to connection to said predetermined voltage and said multiple bit value represented by said output line means thereby being selected;
an output means for outputting said selected multiple bit value.

* * * * *